(12) United States Patent
Ahlgren et al.

(10) Patent No.: US 7,585,740 B2
(45) Date of Patent: Sep. 8, 2009

(54) FULLY SILICIDED EXTRINSIC BASE TRANSISTOR

(75) Inventors: David C. Ahlgren, Wappingers Falls, NY (US); Guy M. Cohen, Mohegan Lake, NY (US); Christian Lavoie, Ossining, NY (US); Francois Pagette, Wappingers Falls, NY (US); Anna W. Topol, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 477 days.

(21) Appl. No.: 11/308,259

(22) Filed: Mar. 14, 2006

(65) Prior Publication Data

US 2007/0218641 A1    Sep. 20, 2007

(51) Int. Cl.
    *H01L 21/331*    (2006.01)
(52) U.S. Cl. .................................... 438/365
(58) Field of Classification Search .......... 438/234, 438/313, 364–369; 257/197, 273
    See application file for complete search history.

(56) References Cited

U.S. PATENT DOCUMENTS

| | | | |
|---|---|---|---|
| 4,164,436 A | 8/1979 | Ura et al. | |
| 6,198,154 B1 | 3/2001 | Pinto et al. | |
| 6,476,452 B2* | 11/2002 | Suzuki | 257/378 |
| 6,492,238 B1 | 12/2002 | Ahlgren et al. | |
| 6,667,521 B2 | 12/2003 | Ahlgren et al. | |
| 6,674,149 B2* | 1/2004 | Ohnishi et al. | 257/591 |
| 6,716,708 B2 | 4/2004 | Cabral, Jr. et al. | |
| 6,828,602 B2 | 12/2004 | Asai et al. | |
| 6,893,934 B2 | 5/2005 | Ohnishi et al. | |
| 6,906,401 B2 | 6/2005 | Dunn et al. | |
| 6,979,884 B2 | 12/2005 | Ahlgren et al. | |
| 7,091,099 B2* | 8/2006 | Ohnishi et al. | 438/320 |
| 2002/0042197 A1 | 4/2002 | Cabral et al. | |
| 2005/0242373 A1 | 11/2005 | Ahlgren et al. | |

OTHER PUBLICATIONS

Sang Hyun Ban, et al., "Formation and Properties of Epitaxial CoSi2 Layers on p-Si0.83Ge0.17/p-Si(001) using a Si Capping Layer by Metal-Organic Chemical Vapor Deposition", The Japan Society of Applied Physics, vol. 42, Jun. 2003, pp. 3350-3353.

G.M. Cohen, et al., "A Self-Aligned Silicide Process Utilizing Ion Implants For Reduced Silicon Consumption and Control of the Silicide Formation Temperature", Material Research Society, IBM T.J. Watson Research Center, vol. 716, 2002, pp. B1.7.1-B1.7.6.

"NiSi integration in a non-selective base SiGeC HBT process," E. Haralson, et al., Materials Science in Semiconductor Processing, 2005, vol. 8, No. 1-3, pp. 245-248.

* cited by examiner

*Primary Examiner*—Calvin Lee
(74) *Attorney, Agent, or Firm*—Joseph P. Abate; Greenblum & Bernstein P.L.C.

(57) ABSTRACT

A system and method comprises forming an intrinsic base on a collector. The system and method further includes forming a fully silicided extrinsic base on the intrinsic base by a self-limiting silicidation process at a predetermined temperature and for a predetermined amount of time, the silicidation substantially stopping at the intrinsic base. The system and method further includes forming an emitter which is physically insulated from the extrinsic base and the collector, and which is in physical contact with the intrinsic base.

18 Claims, 14 Drawing Sheets

FULLY SILICIDED EXTRINSIC BASE TRANSISTOR

FIELD OF THE INVENTION

The invention generally relates to the field of bipolar transistors and, more specifically, to hetero-junction bipolar transistors having fully silicided extrinsic base structures, and thus reduced parasitic resistance and higher maximum oscillation frequency.

BACKGROUND DESCRIPTION

In the manufacture of bipolar transistors, the trend in the semiconductor industry is to increase the switching speed performance of such transistors. It is well known in the art, though, that the performance of a bipolar transistor is limited by the maximum oscillating frequency of the device. Parasitic resistance in both the base and the emitter of the transistor tend to limit the maximum oscillation frequency of the device, effectively limiting the switching speed. Therefore, a reduction in the resistance of the base, the emitter, or both, will increase the performance of the device. Particularly with the development of wireless and broadband applications, and as transistor switching speeds exceed 350 GHz, it is crucial to lower the parasitic resistance in order to increase the performance of the device.

In the prior art, the extrinsic base region of a typical hetero-junction bipolar transistor is formed of doped Polysilicon, and may be covered with a Silicide region, also known as a salicide region. As transistors are scaled to ever-smaller dimensions though, the parasitic resistance of such a device becomes large relative to its intrinsic resistance.

Additionally, it is important that any method of fabricating bulk quantities of such transistors be as efficient as possible. For this reason, it is desirable that a method of manufacture employ materials that are compatible with conventional Silicon processes, and that the method has as little complexity as possible and results in a low defect rate.

In view of the foregoing, there is a need in the art for an improved transistor having a higher maximum oscillation frequency, and a simple and reliable method of fabricating such a transistor.

SUMMARY OF THE INVENTION

In a first aspect of the invention, a method is provided for the fabrication of a hetero-junction bipolar transistor having a collector region formed in a semiconductor substrate, an intrinsic base formed on the surface of the substrate, an extrinsic base formed of Cobalt Disilicide in physical contact with the intrinsic base, and an emitter in physical contact with the intrinsic base but not in physical contact with the extrinsic base.

In a second aspect of the invention, a method comprises forming a hetero-junction bipolar transistor having a collector, an intrinsic base formed of a semiconducting alloy, an extrinsic base formed of Cobalt Disilicide, and an emitter. The method includes a self-limiting Cobalt Disilicide formation process by annealing at a predetermined temperature for a predetermined amount of time such that the silicidation process stops at or before the intrinsic base layer.

In a third aspect of the invention, a device comprises a collector region in a substrate and an intrinsic base region formed on the substrate. The device further comprises a fully silicided extrinsic base region formed on the intrinsic base region, and an emitter region which is physically insulated from the extrinsic base and the collector, and which is in physical contact with the intrinsic base.

DETAILED DESCRIPTION OF EMBODIMENTS OF THE INVENTION

The invention is generally directed to semiconductor transistors, and more particularly to hetero-junction bipolar transistors having fully silicided extrinsic base structures and a method of manufacture thereof. The device and method of the present invention reduce the parasitic resistance of the extrinsic base, and thus increase the maximum oscillating frequency of the transistor, by forming an extrinsic base of Cobalt Disilicide. Additionally, the present invention enables efficient fabrication of the device because the silicidation process is self limiting, which reduces the possibility of an electrical short between the extrinsic base Disilicide and the collector.

Figure 1:
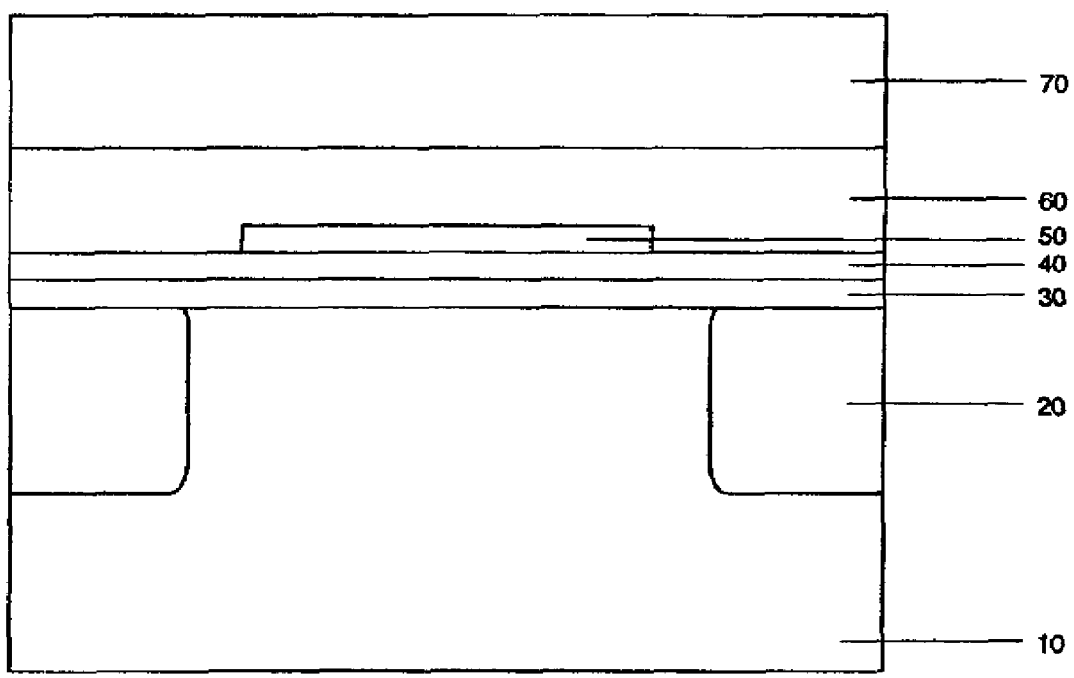
FIGS. 1 through 13 are representative of sectional schematic views of processing step(s) in accordance with the invention (not to scale).

FIG. 1 is a sectional schematic view (not to scale) of a hetero-junction bipolar structure formed in accordance with a preferred embodiment of the invention. In particular, FIG. 1 shows the beginning structure of the formation of a collector region, an intrinsic base region, and an extrinsic base region.

In one embodiment of the invention, as shown in FIG. 1, a collector 10 is formed in a substrate. The substrate may be any conventional material such as, for example, Silicon. A first insulating layer 20, also referred to as the shallow trench isolation (STI) is formed in the collector 10. A semiconducting alloy layer 30, which forms the intrinsic base region of the transistor, is formed on the collector 10 and the first insulating layer 20. In a preferred embodiment, the semiconducting alloy layer may be Silicon Germanium. The semiconducting alloy layer 30 may be grown in any of several different conventional manners, including for example ultra high vacuum chemical vapor deposition (UHVCVD).

A cap 40 is formed on the semiconducting alloy layer 30, by conventional manners, including for example, low temperature epitaxy (LTE). In a preferred embodiment, the cap 40 may be Silicon. A landing pad 50, also sometimes referred to as an etch stop layer, is formed on the cap 40, again by conventional methods, including for example by depositing a blanket layer of Oxide, followed by lithography and etching process.

A first Polysilicon layer 60 is formed on the cap 40 and the landing pad 50, again in a conventional manner. The first Polysilicon layer 60 is used to form the extrinsic base region of the transistor, as discussed in greater detail below. The first Polysilicon layer 60 may be doped. A second insulating layer 70 is formed on the first Polysilicon layer 60, again in a conventional manner.

Although FIGS. 1-14 show a single-level structure, i.e., a single level wiring layer, shown for illustrative purposes, it should be understood by those skilled in the art that the structure shown and described herein can be a multi-level structure of several layers. The methods of manufacturing described herein are equally applicable to such a multi-level structure.

Figure 2:
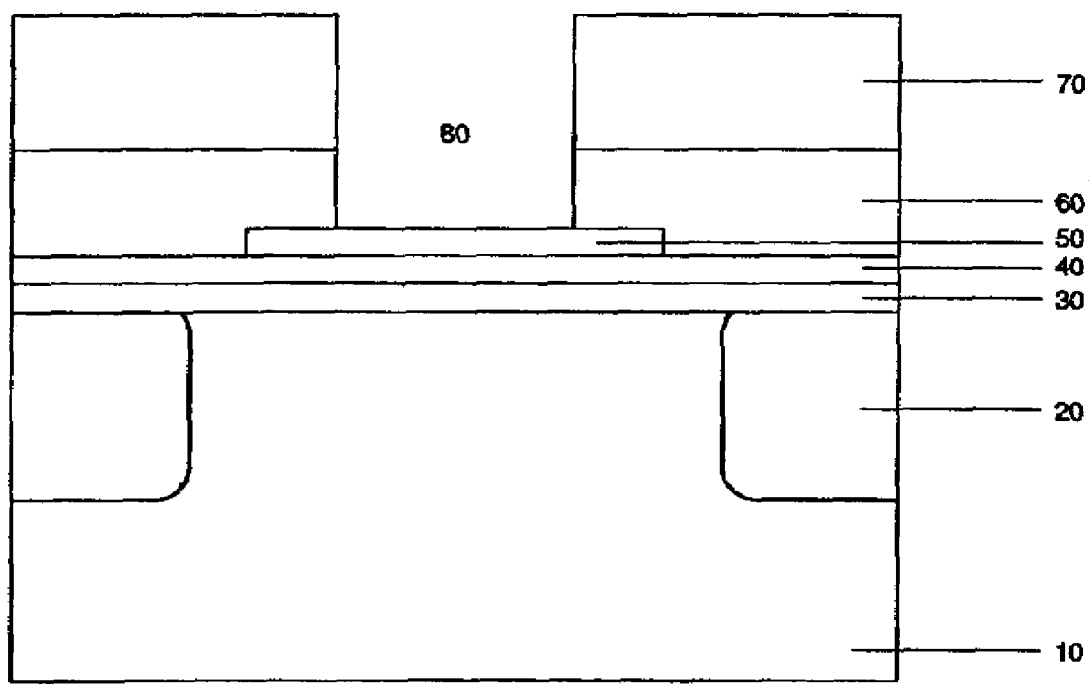

FIG. 2 illustrates a further step of the inventive method, which includes forming an opening 80 through the second insulating layer 70 and the first Polysilicon layer 60, down to the landing pad 50. This opening is formed by any conventional process, such as for example lithography and etching processes. As will be understood by those of skill in the art, it is desirable that the opening 80 be as narrow as possible. Further, it is important that the opening 80 be narrower than the width of the landing pad 50.

Figure 3:
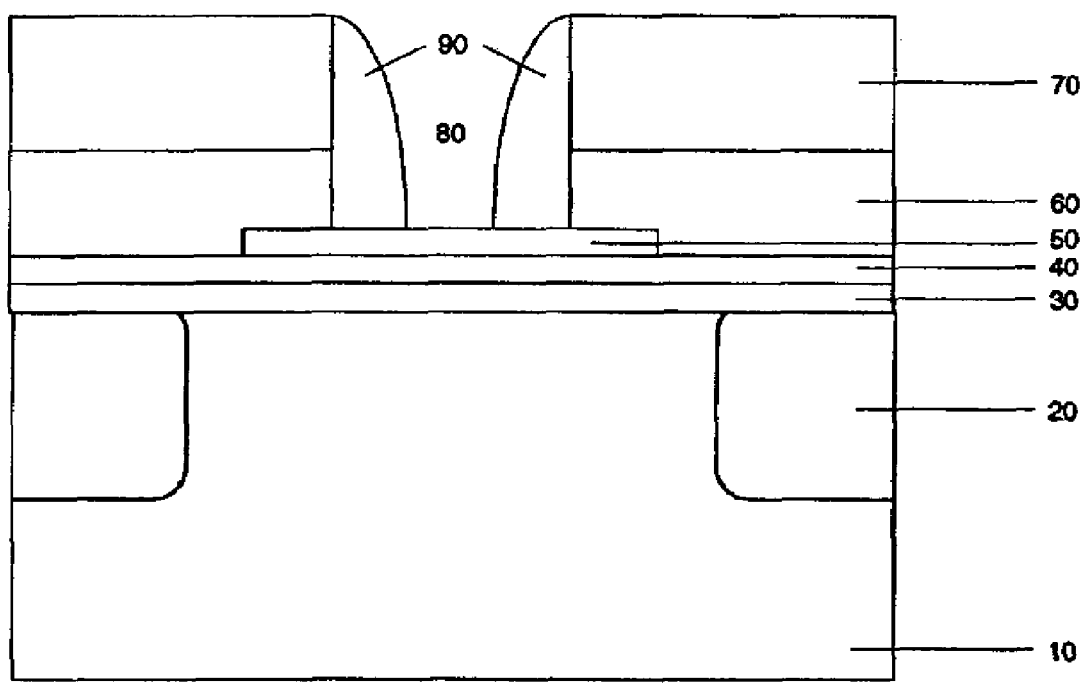

FIG. 3 illustrates a further step of the inventive method, which includes forming spacers 90 on the sidewalls of the opening 80. The spacers 90 are formed by any conventional process, such as for example, depositing a blanket layer of Nitride and etching back.

Figure 4:
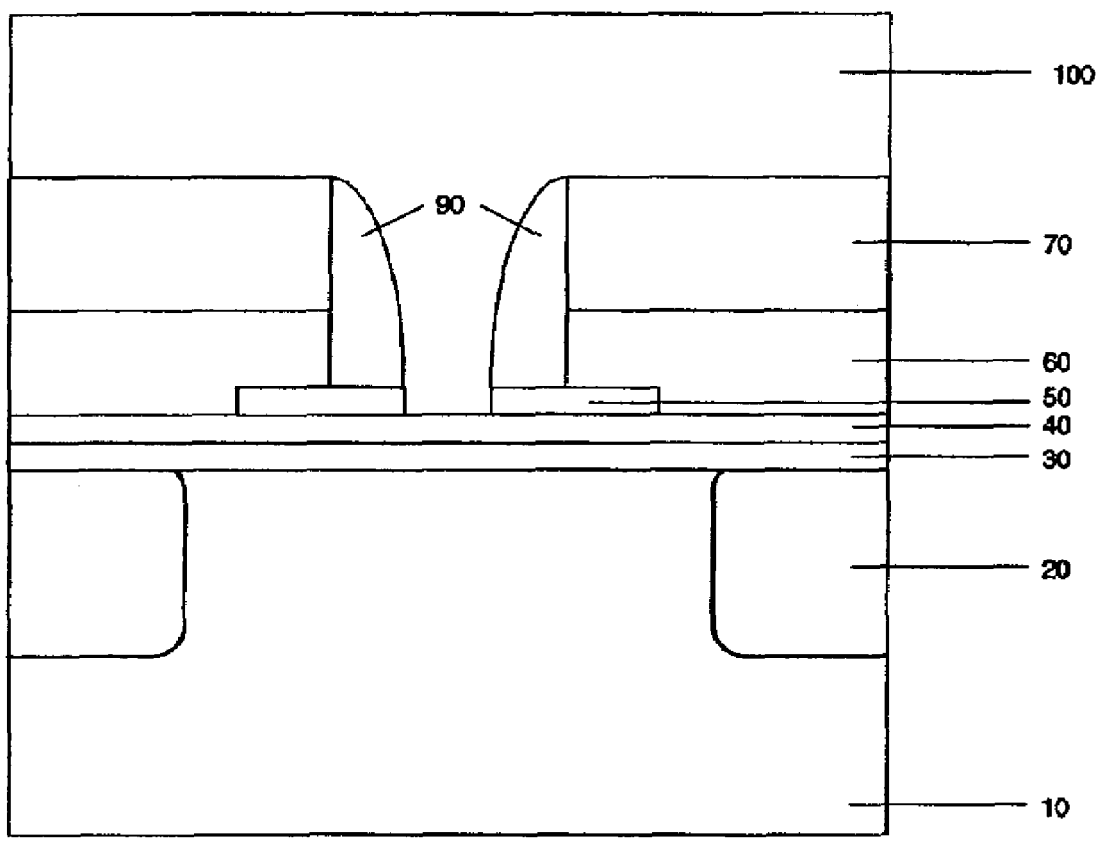

FIG. 4 illustrates a further step of the inventive method, which includes formation of the emitter region of the transistor. In this step, the landing pad 50 is first opened up to the cap 40, which may be accomplished by any conventional manner such as a wet etch. A second Polysilicon layer 100 is then deposited on the exposed portion of the cap 40, the exposed edges of the spacers 90, and the second insulating layer 70. This second Polysilicon layer 100 may be in situ doped, or may be deposited and then implanted.

Figure 5:
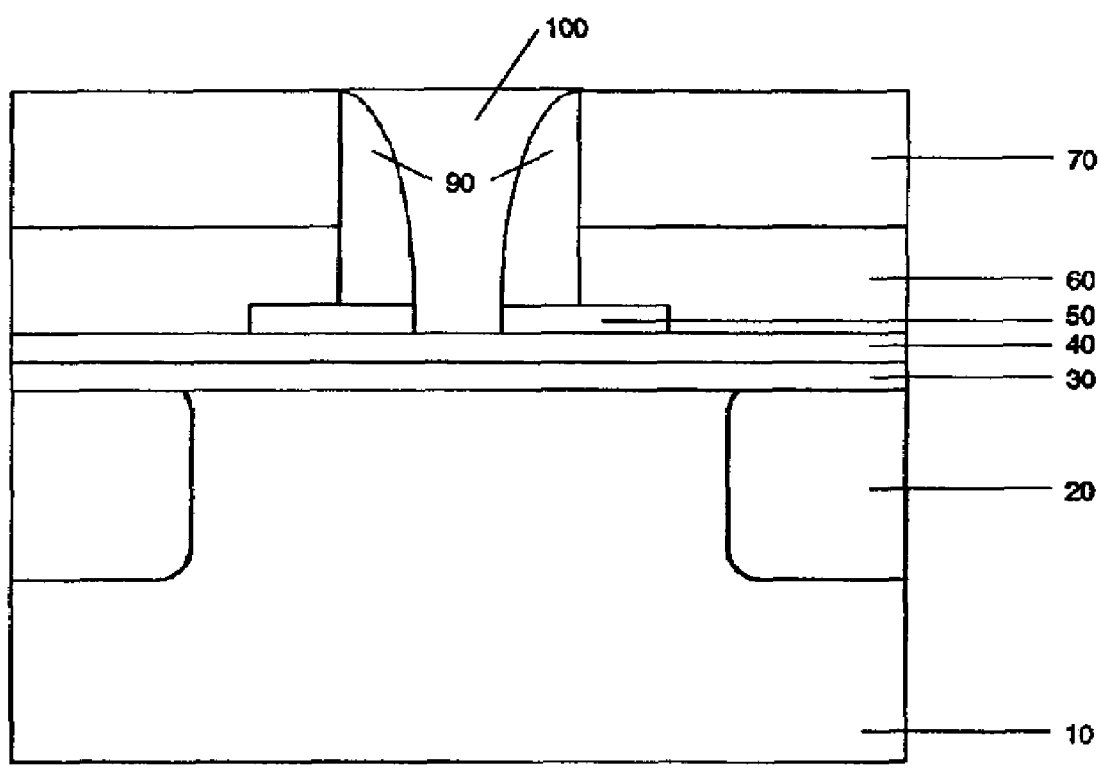

FIG. 5 illustrates a further step of the inventive method, which includes planarization to remove the excess second Polysilicon layer 100. The remaining Polysilicon layer 100 forms the emitter region within the opening 80 and between the spacers 90.

Figure 6:
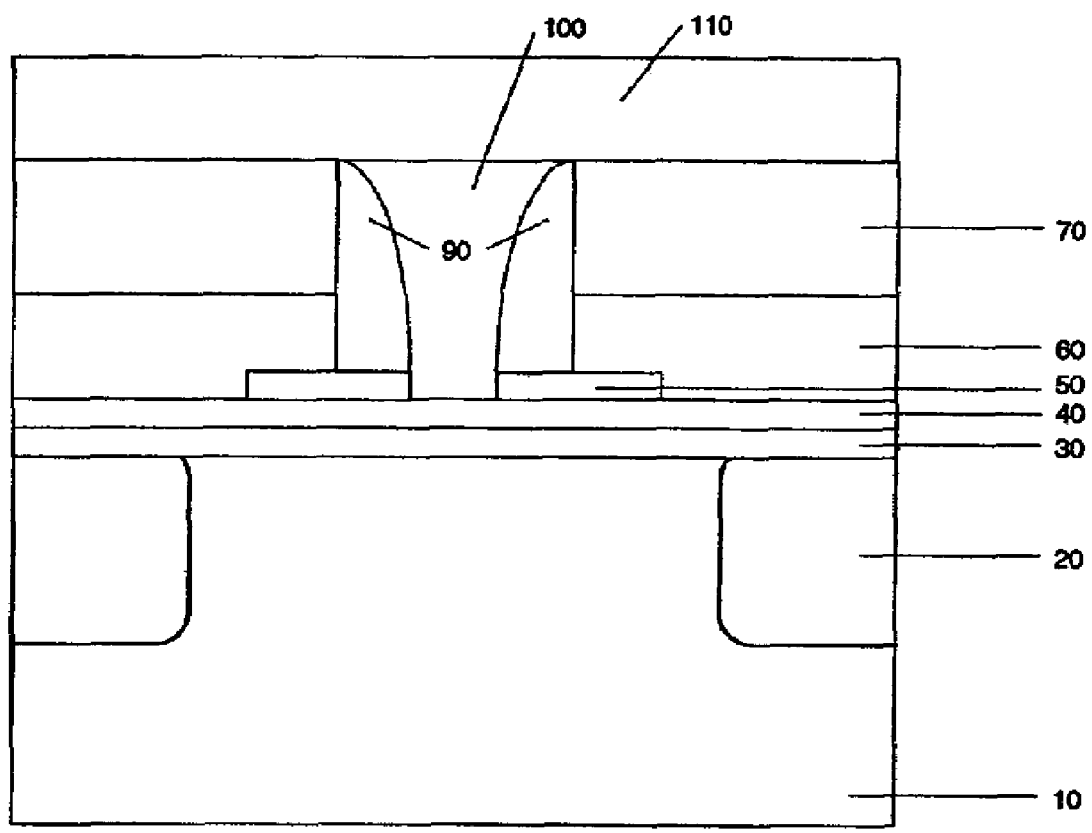

In an alternative embodiment, the emitter Polysilicon region of the transistor may be partially silicided or metallized. For example, FIG. 6 illustrates this alternative step of the inventive method, which includes deposition of an optional metal layer 110 on the second Polysilicon layer 100 and the second insulating layer 70. In a preferred embodiment, the optional metal layer 110 may be Cobalt. As will be seen in later steps of the inventive method when Cobalt is used, it will eventually form a Cobalt Disilicide in the remaining second Polysilicon layer 100, upon further processing (FIGS. 7 & 8).

Cobalt Disilicide is often preferred for such applications because of its low resistivity and its compatibility with the extrinsic base Silicide. If this optional step is omitted, then the steps as illustrated in FIGS. 7 and 8 are also omitted, and the method proceeds with the step(s) described in FIG. 9. The effect of this optional step is that the contact in the emitter region is formed first, only then followed by a second contact in the extrinsic base region. If this optional step is omitted, the Silicide may be formed in the emitter and the extrinsic base at the same time; or the Silicide may be formed in the extrinsic base but not in the emitter.

Figure 7:
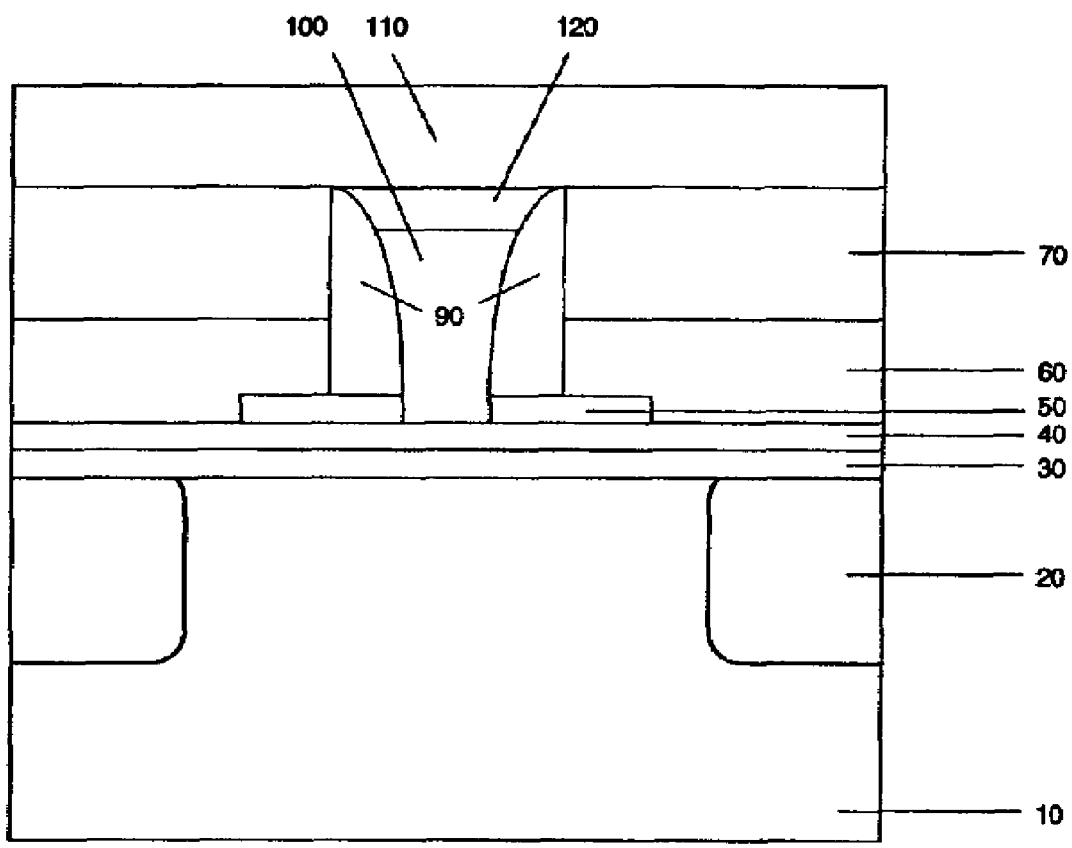

FIG. 7 illustrates a further alternative step of the inventive method, which includes a lower temperature anneal. When the optional metal layer 110 is Cobalt, then the anneal is performed at approximately 550° C. This first anneal can typically vary from 450° C. to close to 600° C. as long as the Disilicide phase does not start to form. The temperature range is preferably between 500 and 550° C. The Cobalt Silicide phase formed is typically the monosilicide (CoSi) and may also be a mix of $Co_2Si$ and CoSi for the lower temperatures. This lower temperature anneal step forms this optional Cobalt Silicide layer 120 in the upper portion of the second Polysilicon layer 100, which is effectively the emitter Polysilicon region. It is important that this anneal process forms a Cobalt Silicide only in a portion of the second Polysilicon layer 100, and that the silicidation does not penetrate through to the cap 40. This is typically achieved by optimizing the amount of Cobalt deposited but can also be controlled through the combination of the anneal temperature and the length of time of the anneal process for a given film thickness, as will be understood by one of skill in the art. The time and temperature of this lower temperature anneal process should be such to ensure that a short between the emitter and collector regions does not result.

Figure 8:
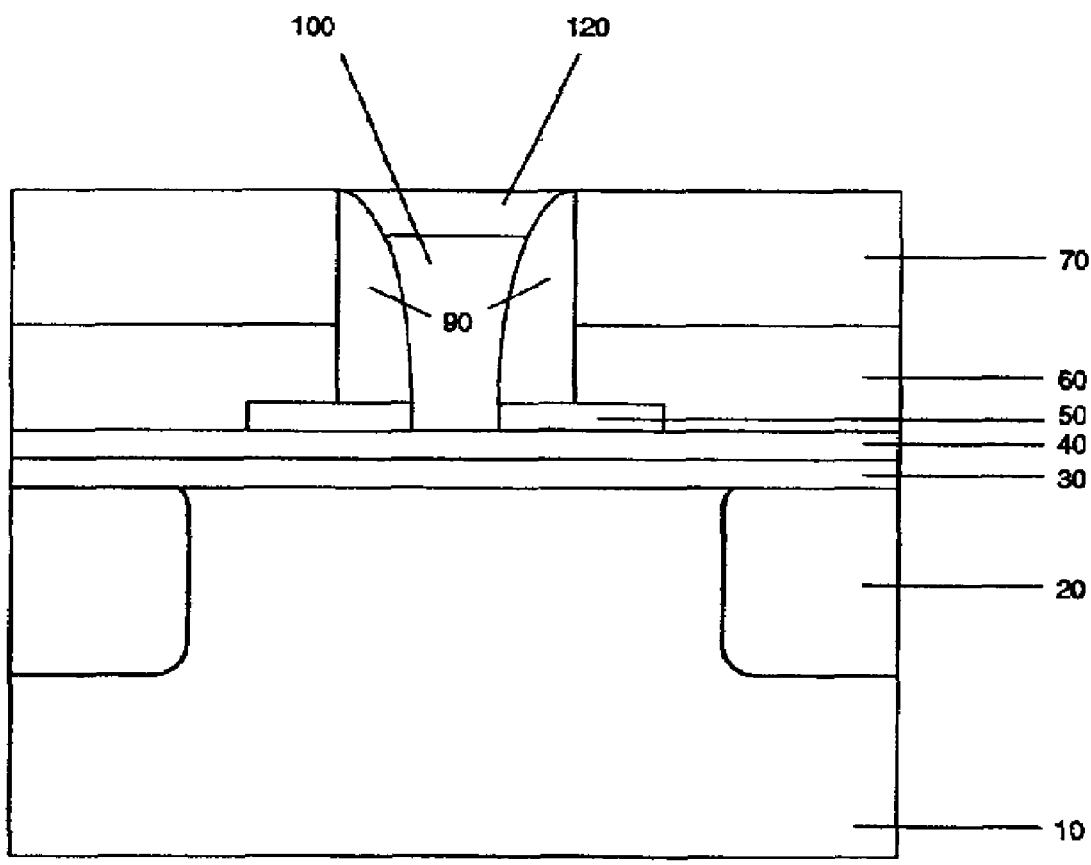

FIG. 8 illustrates a further alternative step of the inventive method, which includes selectively etching the optional Cobalt layer 110. The unused portion of the optional Cobalt layer 110 is removed down to the level of the spacers 90.

Figure 9:
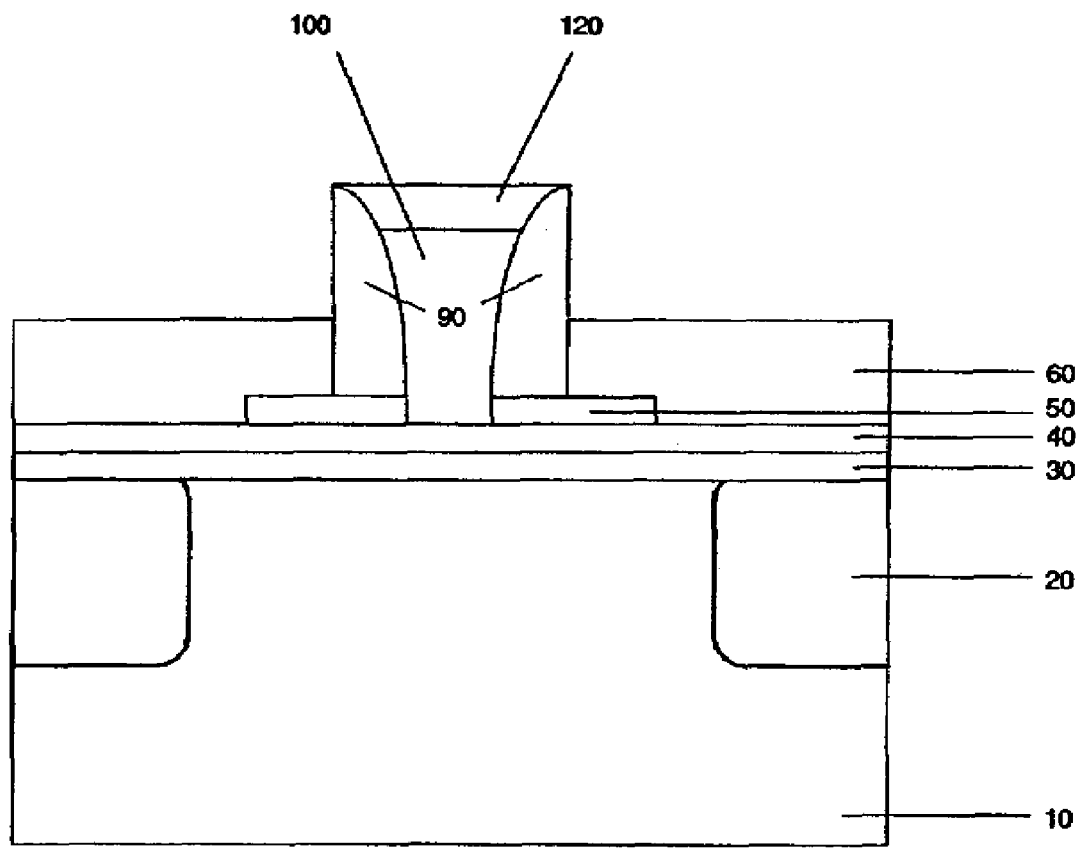

FIG. 9 illustrates a further step of the inventive method, which includes selectively etching the second insulating layer 70. The second insulating layer 70 is removed down to the level of the first Polysilicon layer 60.

Figure 10:
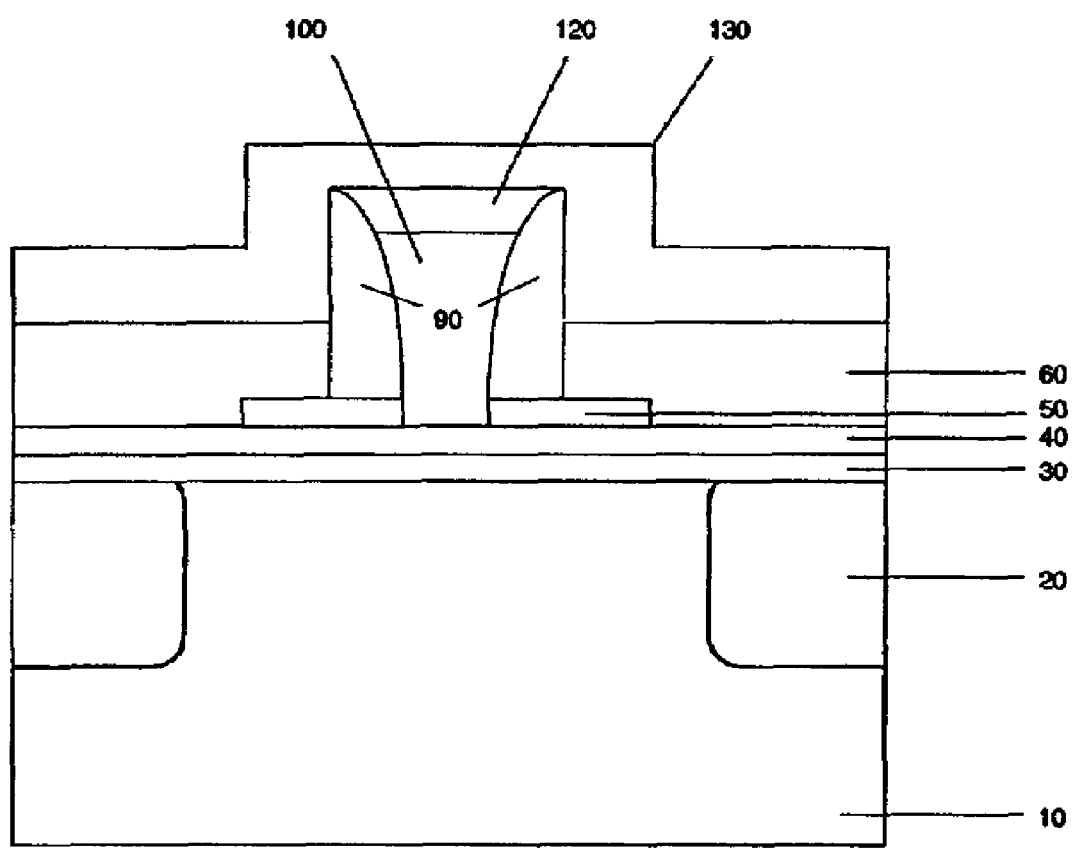

FIG. 10 illustrates a further step of the inventive method, which includes conformal deposition of a metal layer 130 on the first Polysilicon layer 60 and the Cobalt Silicide layer 120, or the remaining second Polysilicon layer 100 if the alternative steps of FIGS. 6-8 have not been implemented. In a preferred embodiment, the metal layer 130 may be Cobalt. It is understood by those skilled in the art that the thickness of this Cobalt layer must be more than 28% of the thickness of the underlying Polysilicon layer to ensure full silicidation and selectivity at the Silicon Germanium interface. This ensures that the system is not in a Silicon-rich situation where the Disilicide would later form and not reach the Polysilicon/Silicon Germanium interface. A higher temperature anneal is then performed, forming a Cobalt Disilicide layer.

Figure 11:
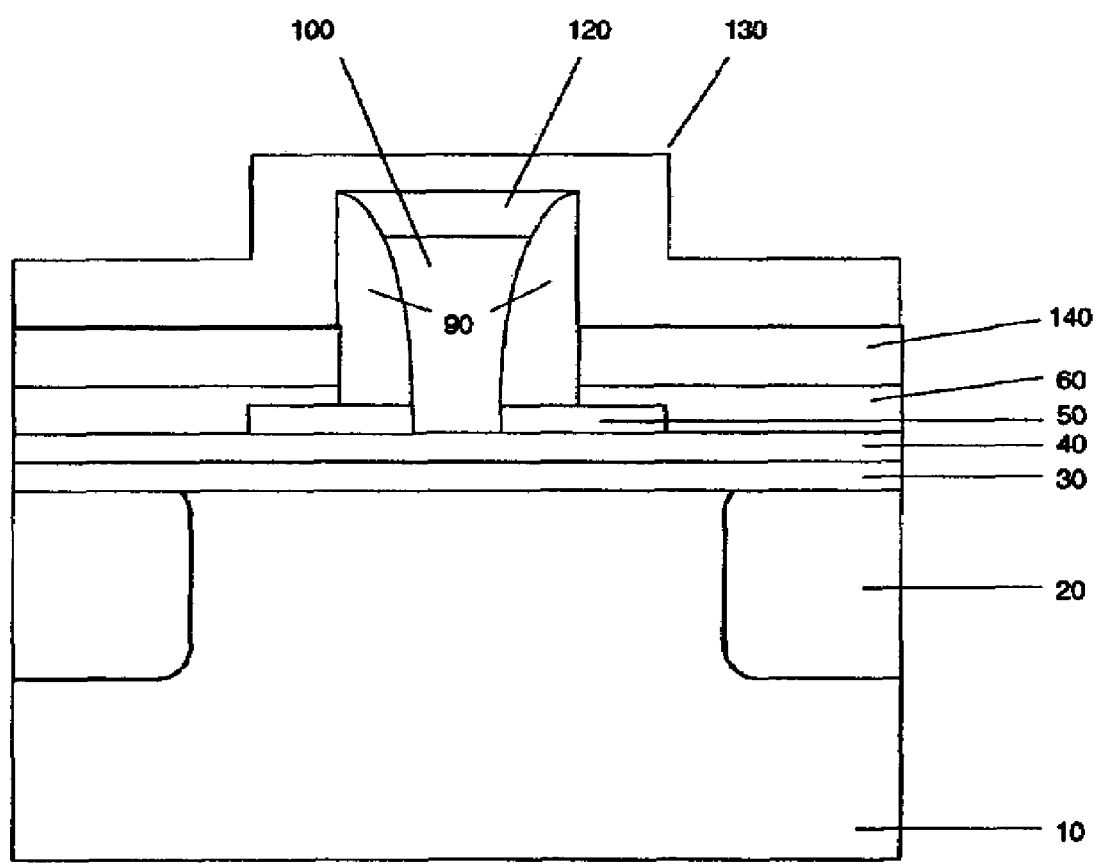

FIG. 11 illustrates an alternative step of the inventive method, which includes a lower temperature anneal. When the metal layer 130 is Cobalt, then the anneal is performed at approximately 550° C. in order to form Cobalt monosilicide (CoSi). This first anneal can typically vary from 450° C. to close to 600° C. as long as the Disilicide phase does not start to form. The temperature range is preferably between 500 and 550° C. While the Cobalt Silicide phase formed is typically the monosilicide (CoSi), it may also be a mix of $Co_2Si$ and CoSi for the lower temperatures. This lower temperature anneal step forms a Cobalt Silicide region 140 in a portion of the first Polysilicon layer 60, and an optional Cobalt Silicide region 120 in a portion of the second Polysilicon layer 100 (if not previously formed in the optional steps illustrated in FIGS. 6-8). If the Cobalt Silicide layer 120 was already formed, the surface oxide that forms above the Cobalt Silicide is typically difficult to remove and sufficient to block any Cobalt diffusion and prevent further silicidation of the Polysilicon layer 100 below the Cobalt Silicide layer 120 at the temperatures used for the silicidation of layer 60. If further silicidation is needed, cleaning techniques known to those skilled in the art allows for the oxide removal and the diffusion of Cobalt at selected temperatures. Alternately or concurrently, the anneal temperature/time can also be increased to force Cobalt diffusion.

This lower temperature anneal process forms a Cobalt Silicide only in a portion of the Polysilicon layers 100 and 60 (if not already performed in layer 100). The silicidation is at a lower temperature and is stopped before it penetrates through the cap 40 since this would cause a short between the base and collector regions. This is achieved by optimizing the amount of metal deposited and the length of time of the anneal process for a given film thickness, as will be understood by one of skill in the art. The time and temperature of this lower temperature anneal process should be such to ensure that a short with the collector region does not result.

Figure 12:
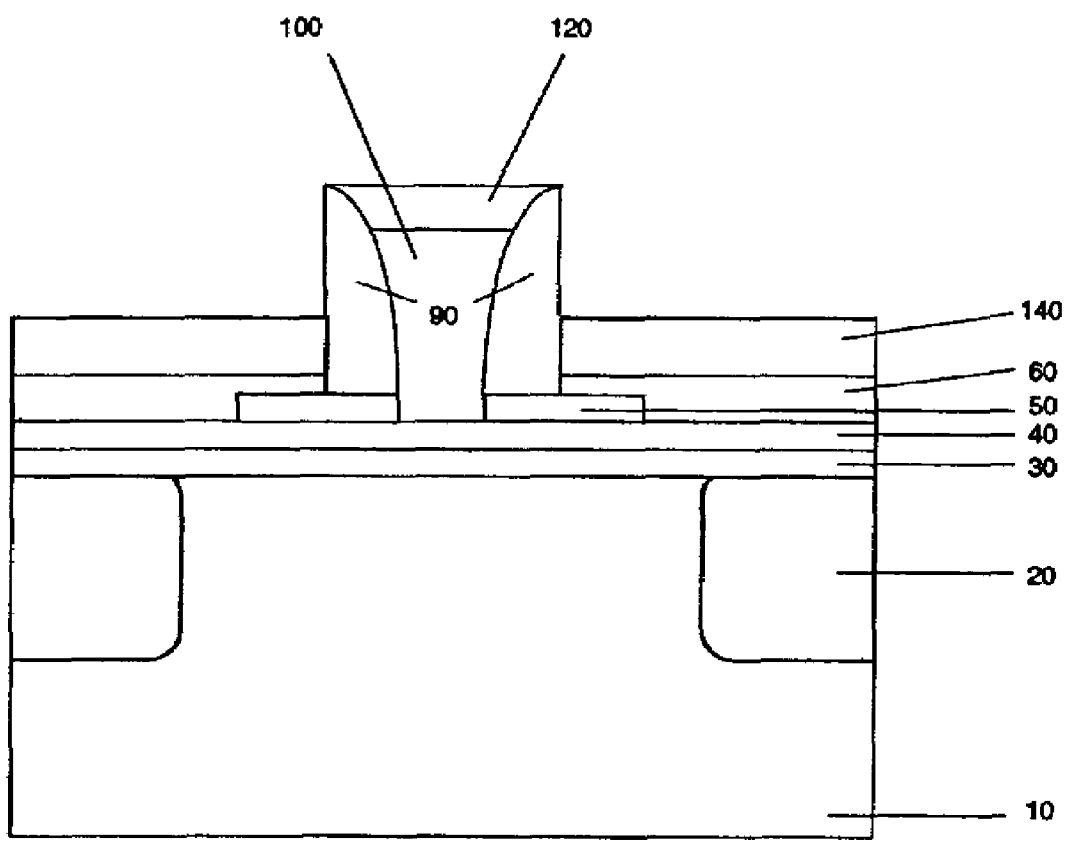

FIG. 12 illustrates a further step of the inventive method, which includes removing the portion of the metal layer 130 that has not reacted with the Polysilicon layers 100 and 60.

This removal is accomplished by any conventional method which is known to those of skill in the art.

Figure 13:
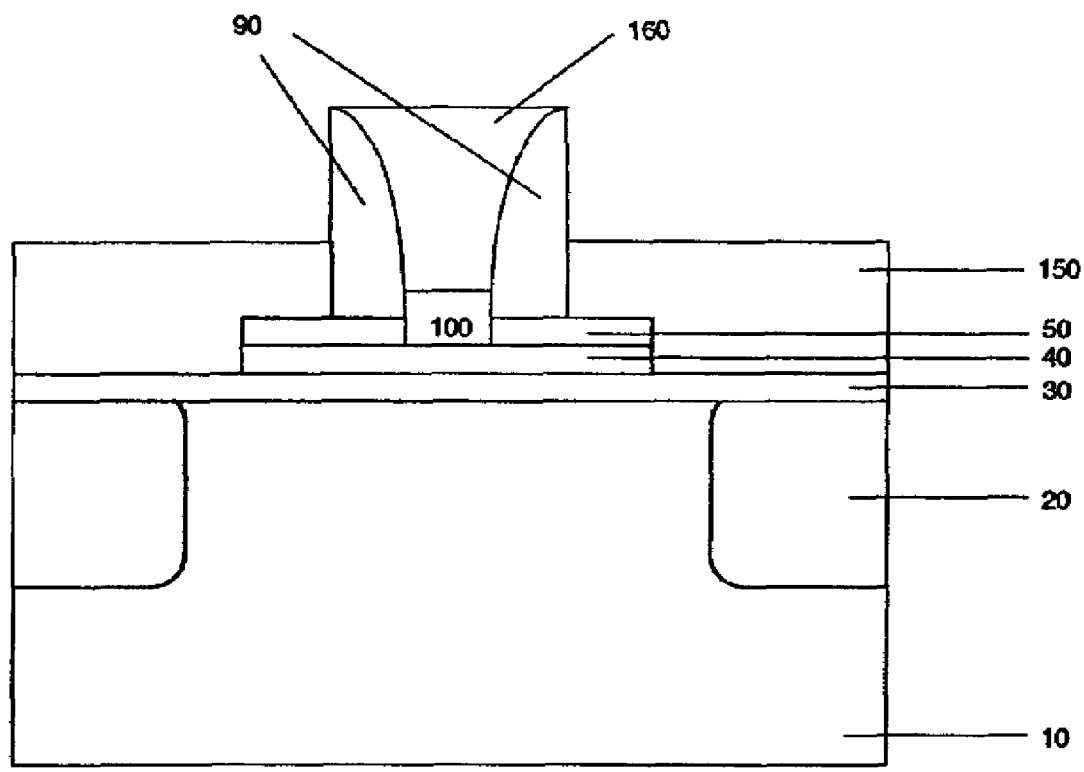

In the case of a lower temperature anneal, FIG. 13 illustrates a further step of the inventive method, which includes a higher temperature anneal to form a contact (in a preferred embodiment, Cobalt Disilicide, $CoSi_2$) region 150 in the first Polysilicon layer, the Cobalt Silicide region, and the cap. In an alternative embodiment, this higher temperature anneal also forms a Cobalt Disilicide region 160 in a portion of the second Polysilicon layer and the optional Cobalt Silicide layer. Thus, this higher temperature anneal step forms Cobalt Disilicide regions 150 and 160 in the extrinsic base and in the emitter of the transistor. This higher temperature anneal may be conducted at a temperature between approximately 600° C. and 800° C., for a time ranging from about 10 seconds to about 30 minutes. In a preferred embodiment, the higher temperature anneal may be conducted at a temperature between approximately 700° C. and 750° C., for a time ranging from about 20 seconds to about 2 minutes.

The formation of the Cobalt Disilicide does not penetrate into the semiconducting alloy layer 30, e.g., the Silicon Germanium layer, since the higher temperature anneal process is self-limiting. The self-limiting nature of the higher temperature anneal process thus prevents electrical shorts, for example, between the extrinsic base and the collector. As will be understood by one of skill in the art, the length of time of the anneal depends upon the thickness of the film. This selectivity originates from the low solubility of Germanium in the Cobalt Disilicide. As a result, it is more difficult to form a Disilicide in the presence of Germanium since it requires more energy to expel the Germanium from the growing Cobalt Disilicide grain. With a judicial choice of anneal temperature and time, the Disilicide growth then proceeds easily to the boundary between the Silicon and the Silicon Germanium and is hindered there by the presence of the Germanium. For Germanium content reaching 20%, an increase of more than 100° C. is typically observed allowing for a large process window.

As will be understood by one of skill in the art, in a preferred embodiment, the temperature limits of the higher temperature anneal are a function of the molecular fraction percentage of Germanium in the Silicon Germanium layer 30. More Germanium in layer 30 allows for more selectivity. For example, if the Germanium content of the Silicon Germanium layer 30 were 5%, then the silicidation process will be self-limiting at temperatures between approximately 625° C. and 725° C. As the molecular fraction percentage of Germanium in the Silicon Germanium layer 30 increases, the upper limit of this temperature rises. For example, if the Germanium content of the Silicon Germanium layer 30 were 30%, then the silicidation process will be self-limiting at temperatures between approximately 625° C. and 800° C. That is, between certain temperatures, the Cobalt Disilicide will be formed in the Polysilicon layers 100 and 60 but not in the Silicon Germanium layer 30. Such a process is also referred to as self-limiting silicidation, or self-limiting salicidation. In this way, the probability of a base-collector short is greatly reduced. This selectivity will also depend on dopant in the Polysilicon layer. One should note here that the selectivity is reduced for large concentration of Arsenic dopants in the Polysilicon since the formation of the Disilicide is also hindered by large concentration of n-type dopants. For selectivity alone, it is preferable that the Polysilicon be undoped. Heavily doped Boron Polysilicon represents a intermediate case between Arsenic-doped and undoped Polysilicon in terms of formation hindering by dopants. As will be understood by one of skill in the art, silicide can be formed on Boron-doped, Arsenic-doped, and undoped Polysilicon with the appropriate optimization of the formation conditions.

Figure 14:
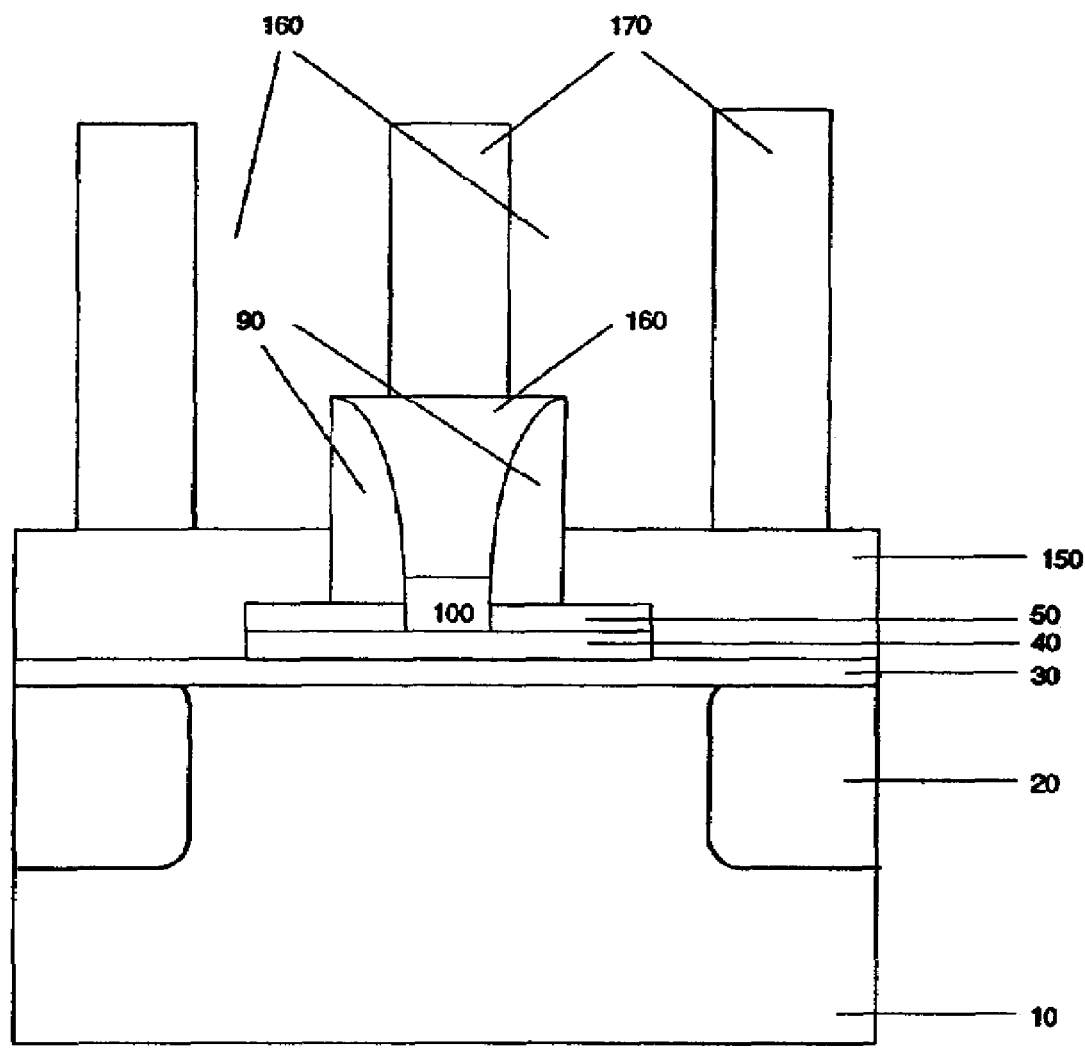
FIG. 14 is representative of a sectional schematic view of a hetero-junction bipolar transistor having a fully silicided extrinsic base prepared according to the process of the present invention.

FIG. 14 is representative of a sectional schematic view of a hetero-junction bipolar transistor having a fully silicided extrinsic base prepared according to the process of the present invention. In order to fabricate this structure, further steps of the inventive method, which include the conventional back end of line steps, are performed. These include depositing a third insulating layer 160 and forming the contacts 170 by conventional methods such as for example, by lithography and etching.

In a preferred embodiment, the extrinsic base region of the present invention is formed of Cobalt Disilicide, which has a resistivity of 16 to 20 μohms-cm. Thus, the method and structure of the present invention allow reduced parasitic resistance in the extrinsic base. Such reduced parasitic resistance results in a higher maximum oscillation frequency of the transistor. In an alternative embodiment a portion of the emitter region of the present invention is likewise formed of Cobalt Disilicide or other material providing a good contact to the emitter Polysilicon region of the transistor. Since in the alternative embodiment the emitter is metallized before the base the metallization process can be optimized to provide the best condition for reduced parasitic resistance in the emitter, which further results in a higher maximum oscillation frequency of the transistor. This reduction in resistance effectively increases the performance of the device.

A further benefit of the method of the present invention is that the formation of the Cobalt Disilicide in the extrinsic base is self limiting such that the silicidation does not permeate into the Silicon Germanium layer 30, which operates as the intrinsic base of the device. This self-limiting silicidation reduces the probability of a short between the base and the collector of the device.

While the invention has been described in terms of exemplary embodiments, those skilled in the art will recognize that the invention can be practiced with modifications and in the spirit and scope of the appended claims.

What is claimed is:

1. A method of manufacturing a structure, comprising:
   forming an intrinsic base on a collector;
   forming a frilly silicided extrinsic base on the intrinsic base by a self-limiting silicidation process at a predetermined temperature and for a predetermined amount of time, the forming of the silicided extrinsic base substantially stopping at the intrinsic base; and
   forming an emitter which is electrically insulated from the extrinsic base and the collector, and which is in electrical contact with the intrinsic base.

2. The method of claim 1, wherein the intrinsic base is formed of Silicon Germanium.

3. The method of claim 1, wherein the self-limiting silicidation process includes annealing a Cobalt monosilicide region and a Polysilicon region to form a Cobalt Disilicide region.

4. The method of claim 1, wherein the self-limiting silicidation process includes annealing a Cobalt region and a Polysilicon region to form a Cobalt Disilicide region.

5. The method of claim 4, further comprising:
   forming a Cobalt layer on the Polysilicon region on the intrinsic base prior to forming the Cobalt Disilicide region;
   annealing the Cobalt layer to form the Cobalt Disilicide region; and
   removing an unreacted portion of the Cobalt layer.

6. The method of claim 4, wherein the Cobalt Disilicide region forms the extrinsic base.

7. The method of claim 4, wherein the Cobalt Disilicide region forms the extrinsic base and a contact region is formed on the emitter.

8. The method of claim 7, wherein the contact region is formed before the Cobalt Disilicide region forming the extrinsic base.

9. The method of claim 7, wherein the contact region is a second Cobalt Disilicide region and the Cobalt Disilicide regions in the extrinsic base are formed during the same anneal or at substantially the same time.

10. The method of claim 7, wherein the predetermined temperature is between 600° C. and 800° C. for a time ranging from about 10 seconds to about 30 minutes.

11. The method of claim 1, further comprising an anneal process to form a Cobalt Disilicide region in a Polysilicon region which is formed into the fully silicided extrinsic base.

12. The method of claim 11, wherein the silicidation process is self-limiting, and substantially stops at the semiconducting alloy layer in order to prevent an electrical short between the extrinsic base and the collector.

13. The method of claim 1, further comprising forming an intervening cap layer between the fully silicided extrinsic base region and the intrinsic base region.

14. The method of claim 13, wherein the fully silicided extrinsic base region is also formed over and in direct contact with an etch stop layer and abutting sidewalls of the emitter.

15. A device comprising:
a collector region in a substrate;
an intrinsic base region formed on the substrate;
a fully silicided extrinsic base region formed on the intrinsic base region;
an emitter region which is physically separated from the extrinsic base and the collector, and which is in physical contact with the intrinsic base.

16. The device of claim 15, wherein the fully silicided extrinsic base region is formed of Cobalt Disilicide.

17. The device of claim 15, wherein the intrinsic base region is formed of Silicon Germanium.

18. The device of claim 15, wherein the emitter is formed of Cobalt Disilicide.

* * * * *